United States Patent
Kobayashi et al.

(10) Patent No.: US 9,621,338 B2
(45) Date of Patent: Apr. 11, 2017

(54) RADIO COMMUNICATION DEVICE AND FREQUENCY ERROR MEASUREMENT METHOD

(71) Applicant: FUJITSU LIMITED, Kawasaki-shi, Kanagawa (JP)

(72) Inventors: Ryosuke Kobayashi, Kawasaki (JP); Shin Watanabe, Yokohama (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 15/084,900

(22) Filed: Mar. 30, 2016

(65) Prior Publication Data

US 2016/0337043 A1    Nov. 17, 2016

(30) Foreign Application Priority Data

May 11, 2015   (JP) ................................ 2015-096804

(51) Int. Cl.
| | | |
|---|---|---|
| H01Q 11/12 | (2006.01) | |
| H04B 1/04 | (2006.01) | |
| H04L 7/04 | (2006.01) | |
| H04L 7/00 | (2006.01) | |
| H04B 10/27 | (2013.01) | |

(52) U.S. Cl.
CPC ............. *H04L 7/04* (2013.01); *H04B 10/27* (2013.01); *H04L 7/0075* (2013.01); *H04L 7/0091* (2013.01)

(58) Field of Classification Search
CPC .. H03G 3/3042; H03G 3/3047; H03F 1/3247; H04B 2001/0416; H04W 52/52
USPC ................ 455/115.1, 118–120, 126
See application file for complete search history.

(56) References Cited

U.S. PATENT DOCUMENTS

| 8,571,497 | B1* | 10/2013 | Lin ........................ H04B 1/04 455/118 |
| 2010/0304695 | A1* | 12/2010 | Persson .................. G01R 25/00 455/115.1 |
| 2010/0323640 | A1* | 12/2010 | Lozhkin ................ H03F 1/3247 455/113 |

FOREIGN PATENT DOCUMENTS

| JP | 08-032507 | 2/1996 |
| JP | 10-031042 | 2/1998 |

* cited by examiner

*Primary Examiner* — Nhan Le
(74) *Attorney, Agent, or Firm* — Fujitsu Patent Center

(57) ABSTRACT

A radio communication device includes a transmission unit that performs a radio transmission process on a baseband signal in which transmission data is included and that transmits a signal in which the baseband signal is superimposed on a carrier wave; a feedback unit that feeds back the signal transmitted by the transmission unit; a detecting unit that detects a carrier wave component by removing a component corresponding to the baseband signal from a feedback signal that is fed back by the feedback unit; a counting unit that counts the pulses of the carrier wave component detected by the detecting unit; and a calculating unit that calculates a frequency error of the carrier wave by using a count value obtained by the counting unit.

6 Claims, 11 Drawing Sheets

FIG.8

| ACCURACY OF DESIRED ERROR [ppm] | NEEDED MEASURE-MENT TIME [h] |
|---|---|
| 0.01 | 72 |
| 0.02 | 36 |
| 0.03 | 24 |
| 0.04 | 18 |
| 0.05 | 15 |

FIG.9

| ACCURACY OF TIME [$\mu$s] | NEEDED MEASURE-MENT TIME [h] |
|---|---|
| 864 OR LESS | 72 |
| 432 OR LESS | 36 |
| 288 OR LESS | 24 |
| 216 OR LESS | 18 |
| 180 OR LESS | 15 |

RADIO COMMUNICATION DEVICE AND FREQUENCY ERROR MEASUREMENT METHOD

CROSS-REFERENCE TO RELATED APPLICATION

This application is based upon and claims the benefit of priority of the prior Japanese Patent Application No. 2015-096804, filed on May 11, 2015, the entire contents of which are incorporated herein by reference.

FIELD

The embodiments discussed herein are related to a radio communication device and a frequency error measurement method.

BACKGROUND

Conventionally, for example, in radio communication devices, such as base station devices or the like, an error sometimes occurs in the frequency of the radio signal to be transmitted due to, for example, aged deterioration of an internal part in the devices. Furthermore, in recent years, studies have been conducted on a system that connects, by optical fibers, radio equipment control (REC) devices that mainly perform a baseband process on signals and radio equipment (RE) devices that mainly perform a radio process on signals by using, for example, an interface called a Common Public Radio Interface (CPRI). In a radio communication system that uses the CPRI, an error sometimes occurs in the frequency of the radio signal sent from an RE device caused by, for example, aged deterioration of optical fibers.

In the radio communication system, for example, because the frequency defined by law is needed to be used, in general, a periodic inspection is performed to determine whether the frequency error described above is within the range that satisfies the definition. However, because the base station devices and the RE devices are often arranged at a high place, such as on the roof of a building, on a steel tower, or the like, the efficiency of measuring the frequencies sent from these devices by maintenance workers on site is low and the cost is increased. Thus, for example, it is conceivable to arrange the reference oscillation source, such as the Rubidium oscillator source or the like, inside a device and use a method of measuring a frequency error by using a measuring circuit that measures a frequency error of a transmission signal by using the reference signal sent from the reference oscillation source.

Patent Document 1: Japanese Laid-open Patent Publication No. 10-31042

Patent Document 2: Japanese Laid-open Patent Publication No. 08-32507

However, when a frequency error is measured by arranging, for example, a measuring circuit, inside a device, the size of the circuit in the device is increased and the cost is also increased. In particular, because the reference oscillation source that generates stable reference signals is comparatively expensive, the implementation cost for accurately measuring a frequency error is increased. In this way, arranging an additional measuring circuit or the like results in an increase in the size of the device and the cost, which is not practical.

SUMMARY

According to an aspect of an embodiment, a radio communication device includes a transmission unit that performs a radio transmission process on a baseband signal in which transmission data is included and that transmits a signal in which the baseband signal is superimposed on a carrier wave; a feedback unit that feeds back the signal transmitted by the transmission unit; a detecting unit that detects a carrier wave component by removing a component corresponding to the baseband signal from a feedback signal that is fed back by the feedback unit; a counting unit that counts the pulses of the carrier wave component detected by the detecting unit; and a calculating unit that calculates a frequency error of the carrier wave by using a count value obtained by the counting unit.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 8 is a schematic diagram illustrating a specific example of the needed measurement time;

FIG. 9 is a schematic diagram illustrating another specific example of the needed measurement time;

DESCRIPTION OF EMBODIMENTS

Preferred embodiments of the present invention will be explained with reference to accompanying drawings. The present invention is not limited to these embodiments.

[a] First Embodiment

Figure 1:
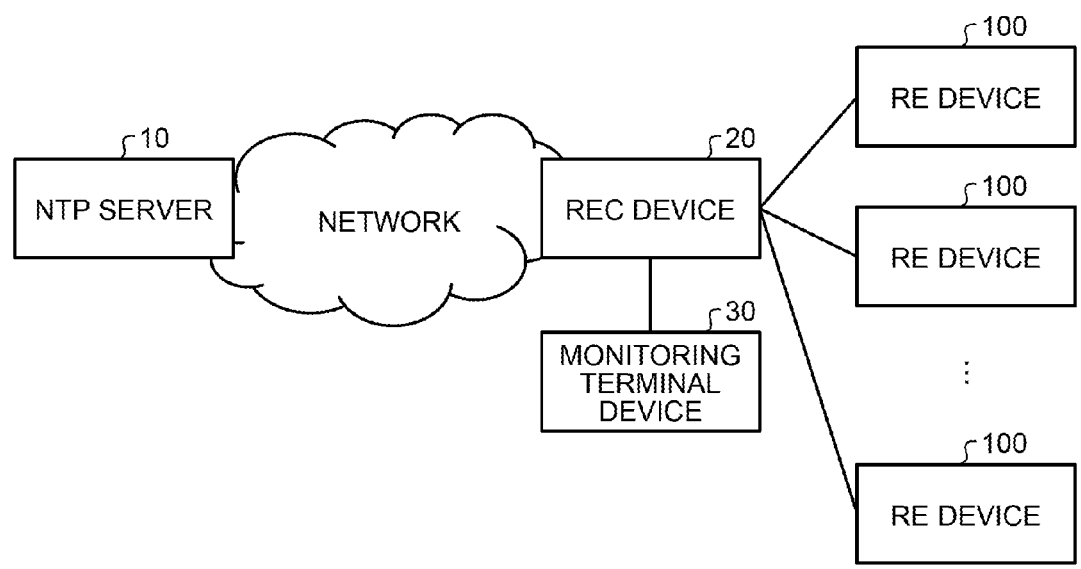
FIG. 1 is a block diagram illustrating the configuration of a radio communication system according to a first embodiment.

FIG. 1 is a block diagram illustrating the configuration of a radio communication system according to a first embodiment. The radio communication system illustrated in FIG. 1 includes a network time protocol (NTP) server 10 and an REC device 20 that are connected via a network. Furthermore, a monitoring terminal device 30 is connected to the REC device 20 and a plurality of RE devices 100 are connected via optical fibers.

The NTP server 10 is a server that distributes the current time by using NTP and that provides the accurate current time via the network.

The REC device 20 performs synchronization with the NTP server 10 at a predetermined period and performs a baseband process on transmission data and reception data. Specifically, the REC device 20 performs, for example, encoding and modulation on the transmission data and sends the obtained baseband signal to the RE devices 100. Furthermore, the REC device 20 performs demodulation and decoding on the baseband signal received from the RE devices 100 and obtains reception data.

The monitoring terminal device 30 monitors the state of the REC device 20 and the RE devices 100 and notifies a user whether, for example, maintenance and inspection, such as replacement of parts, is needed. Specifically, if, for example, the frequency error of the radio signal sent from the RE device 100 is equal to or greater than a predetermined threshold, the monitoring terminal device 30 generates an alarm indicating that state.

The RE devices 100 are connected to the REC device 20 via optical fibers and performs a radio process on the transmission data and the reception data. Specifically, each of the RE devices 100 performs digital-to-analogue (DA) conversion and up-conversion on the baseband signal received from the REC device 20 and sends the obtained radio signal via an antenna. Furthermore, each of the RE devices 100 performs down-conversion and analogue-to-digital (AD) conversion on the radio signal received via the antenna and sends the obtained baseband signal to the REC device 20.

Figure 2:
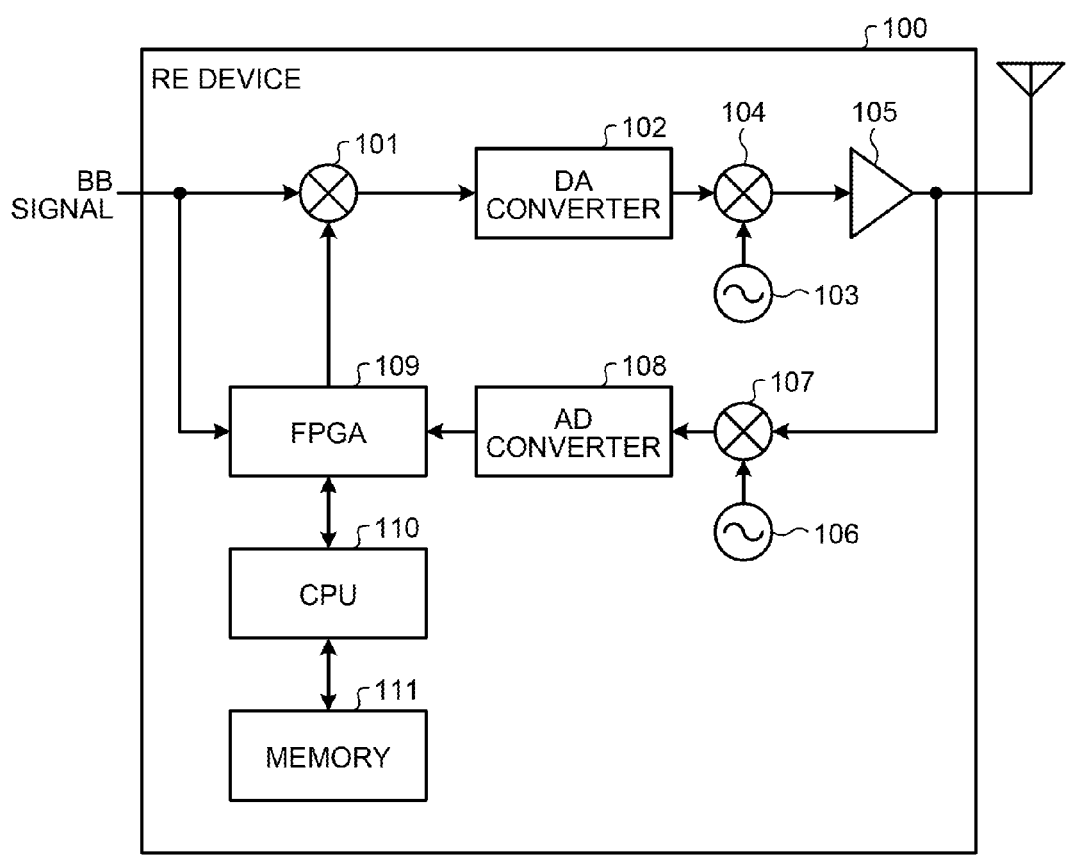
FIG. 2 is a block diagram illustrating the configuration of an RE device according to the first embodiment.

FIG. 2 is a block diagram illustrating the configuration of the RE device 100 according to the first embodiment. In FIG. 2, the configuration mainly related to transmission is illustrated and the configuration related to reception is omitted. The RE device 100 illustrated in FIG. 2 includes a distortion compensator 101, a DA converter 102, an oscillator 103, a modulator 104, a power amplifier 105, an oscillator 106, a mixer 107, and an AD converter 108. Furthermore, the RE device 100 includes a field programmable gate array (FPGA) 109 and a central processing unit (CPU) 110 as a processor and includes a memory 111.

The distortion compensator 101 performs multiplication on a distortion compensation coefficient that is output from the FPGA 109 with respect to the baseband signal (hereinafter, simply referred to as a "BB signal") received from the REC device 20 and performs distortion compensation on the baseband signal. The distortion compensation coefficient is a coefficient used to compensate the nonlinear distortion that occurs in the power amplifier 105.

The DA converter 102 performs DA conversion on the BB signal that has been subjected to the distortion compensation and then outputs the obtained analog BB signal to the modulator 104.

The oscillator 103 generates a local signal with a radio frequency by using the clock of the BB signal.

The modulator 104 performs up-conversion on the local signal that is generated in the oscillator 103 and superimposes the analog BB signal output from the DA converter 102 onto a carrier wave (carrier) that has the radio frequency with the band of, for example, 2 GHz.

The power amplifier 105 amplifies the signal that is up converted by the modulator 104 and sends the amplified signal via the antenna.

The oscillator 106 generates a local signal with the intermediate frequency by using the clock of the BB signal. Because the oscillator 106 uses the same clock as that of the BB signal in the oscillator 103, if the frequency of the local signal generated by the oscillator 103 includes an error, the frequency of the local signal generated by the oscillator 106 also includes the error.

The mixer 107 performs down-conversion by using the local signal that is generated in the oscillator 106 and converts the frequency of the carrier of a feedback signal (hereinafter, simply referred to as an "FB signal") that is fed back from the power amplifier 105 to an intermediate frequency with the band of, for example, 500 kHz.

Figure 3:
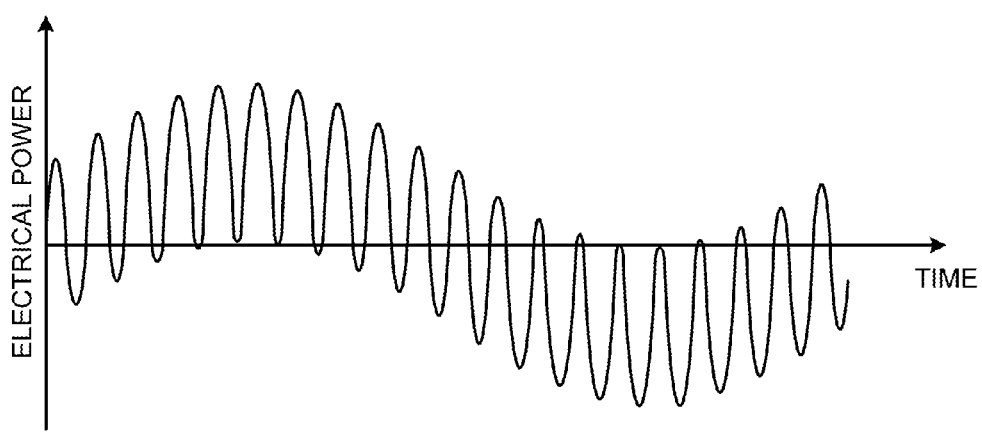
FIG. 3 is a schematic diagram illustrating a specific example of a time waveform of an FB signal.

The AD converter 108 performs AD conversion on the FB signal that has been subjected to the down-conversion by the mixer 107 and then outputs the obtained digital FB signal to the FPGA 109. The FB signal that is output from the AD converter 108 to the FPGA 109 is a signal in which the BB signal is superimposed on the carrier component of the intermediate frequency and that has the time waveform illustrated in, for example, FIG. 3. Namely, the FB signal is a signal in which the baseband component of, for example, 10 MHz is superimposed on the carrier component of, for example, 500 kHz.

The FPGA 109 refers to a look-up table that stores therein distortion compensation coefficients and outputs, to the distortion compensator 101, a distortion compensation coefficient in accordance with the electrical power level of the BB signal. Furthermore, the FPGA 109 updates, on the basis of the FB signal output from the AD converter 108, the distortion compensation coefficients stored in the look-up table. Furthermore, the FPGA 109 detects a carrier component by removing the frequency of the baseband component from the FB signal that is output from the AD converter 108. Then, by counting the pulses of the carrier component during a defined measurement time, the FPGA 109 measures an error of the radio frequency. Furthermore, the specific configuration and processes related to the FPGA 109 will be described in detail later.

The CPU 110 performs, at a predetermined period, synchronization with the REC device 20 that is synchronized with the NTP server 10 and acquires the accurate current time. Then, the CPU 110 acquires, every time the defined measurement time has elapsed, a count value of the pulses of the carrier component from the FPGA 109 and calculates an error of the radio frequency. Namely, the CPU 110 obtains the frequency of the carrier by calculating the number of pulses per second from the count value obtained from the FPGA 109 and then calculates an error between the obtained frequency and the normal frequency.

Furthermore, the CPU 110 notifies the monitoring terminal device 30 of the information related to the calculated error of the frequencies via the REC device 20. At this time, the CPU 110 may also derive a prediction line of the frequency errors from the number of pulses counted in, for example, a plurality of measurement periods and notify the monitoring terminal device 30 of the remaining time before the frequency error reaches a predetermined threshold.

The memory 111 temporarily stores therein various kinds of information used for a process executed by the CPU 110.

Figure 4:
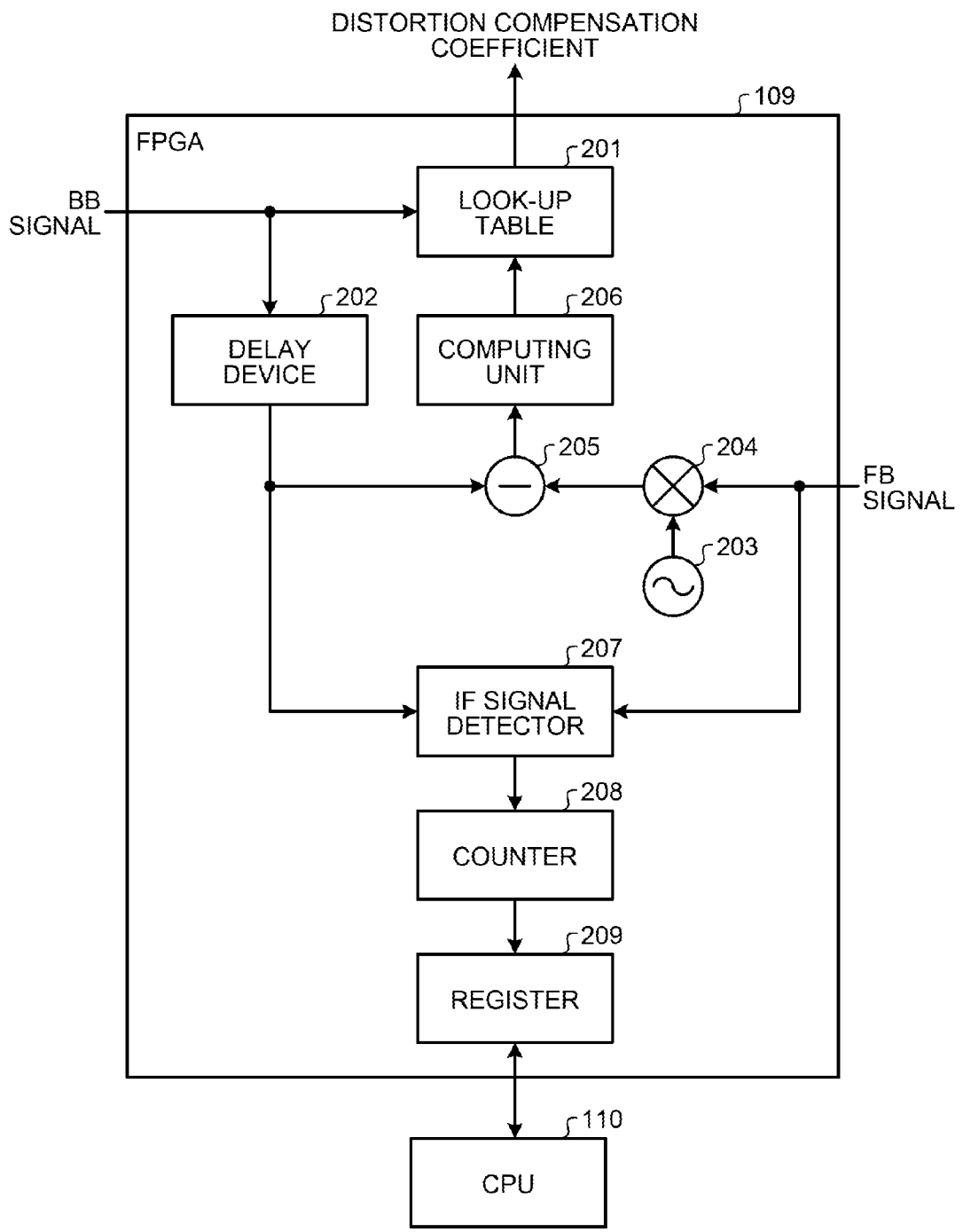
FIG. 4 is a block diagram illustrating the configuration of an FPGA according to the first embodiment.

FIG. 4 is a block diagram illustrating the configuration of the FPGA 109 according to the first embodiment. The FPGA 109 illustrated in FIG. 4 includes a look-up table 201, a delay device 202, an oscillator 203, a mixer 204, a comparator 205, a computing unit 206, an IF signal detector 207, a counter 208, and a register 209.

The look-up table 201 stores therein the distortion compensation coefficients that are associated with the electrical power levels of the BB signal and outputs, to the distortion compensator 101 when the BB signal is input to the FPGA 109, the distortion compensation coefficient that is associated with the electrical power level of the input BB signal.

The delay device 202 delays the BB signal that is input to the FPGA 109 and adjusts the phase to the FB signal that is fed back to the FPGA 109. Namely, the delay device 202 delays the BB signal by temporarily holding the BB signal such that the BB signal and the FB signal that are associated each other can be compared by the comparator 205.

The oscillator 203 generates a local signal that is used to extract a baseband component from the FB signal. Namely, the oscillator 203 generates a local signal with the frequency that is used to remove the carrier component in the FB signal.

The mixer 204 extracts a baseband component from the FB signal by using the local signal that is generated in the oscillator 203. Namely, by removing a carrier component from the FB signal, the mixer 204 extracts a baseband component that can be compared with the BB signal.

The comparator 205 compares the BB signal with the baseband component of the FB signal and outputs the difference between the both to the computing unit 206.

The computing unit 206 calculates a distortion compensation coefficient that makes the difference output from the comparator 205 approach zero and updates the look-up table 201 by using the calculated distortion compensation coefficient. Namely, the computing unit 206 updates the distortion compensation coefficients stored in the look-up table 201 such that the difference between the BB signal and the baseband components of the FB signal becomes zero. Consequently, the accuracy of the distortion compensation coefficients is improved and the nonlinear distortion generated in the power amplifier 105 can be efficiently compensated.

Figure 5:
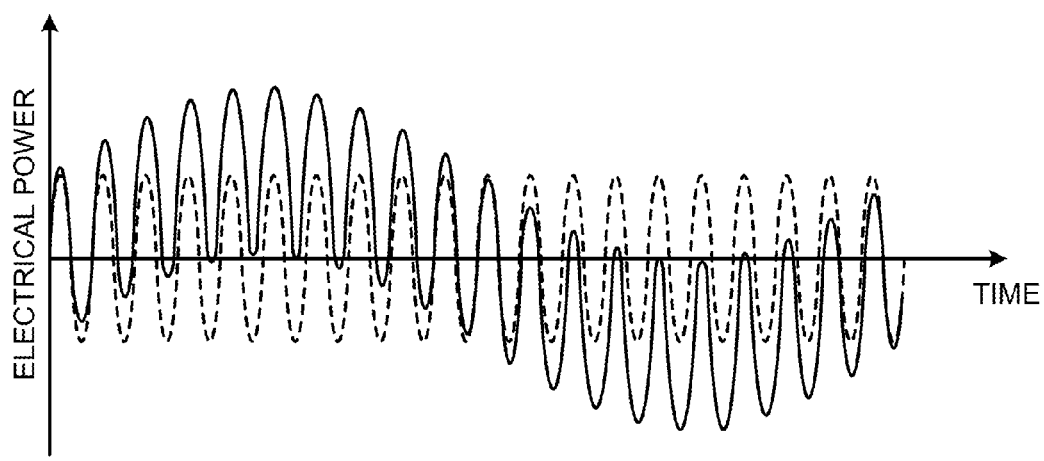
FIG. 5 is a schematic diagram illustrating a specific example of the phase of a BB signal and an FB signal.

The IF signal detector 207 detects the carrier component (hereinafter, referred to as an "IF signal") of the intermediate frequency in the FB signal by using the BB signal and the FB signal. As described above, in order for the delay device 202 to delay the BB signal and adjust the phase of the FB signal to the phase of the BB signal, for example, as illustrated in FIG. 5, the BB signal and the FB signal in which both the phases are matched are input to the IF signal detector 207. Furthermore, in FIG. 5, the solid line indicates the waveform of the FB signal and the broken line indicates the waveform of the BB signal.

Figure 6:
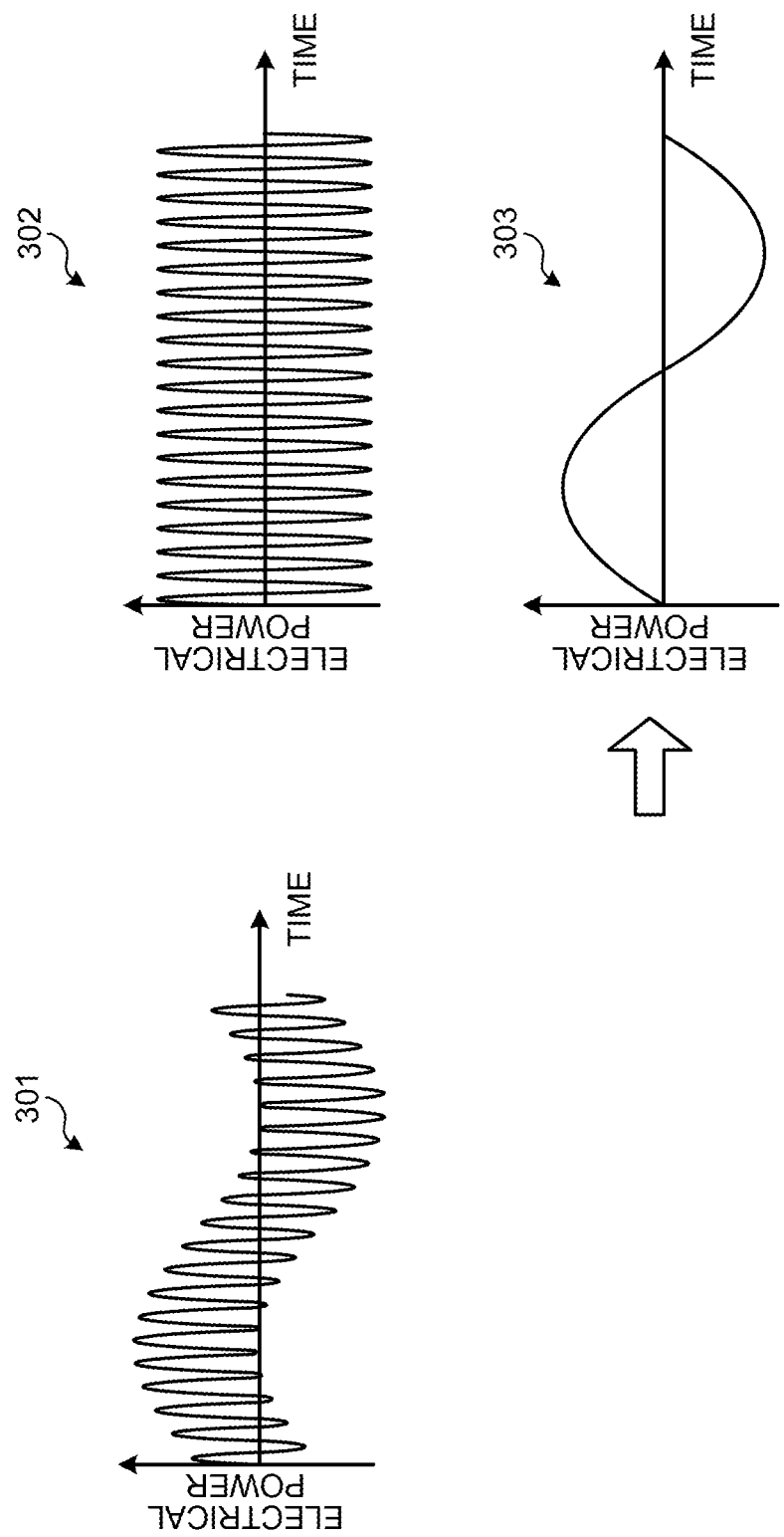
FIG. 6 is a schematic diagram illustrating detection of an IF signal.

If the BB signal and the FB signal with the same phase are input, by removing a baseband component from the FB signal, the IF signal detector 207 acquires the IF signal that corresponds to the carrier component of the FB signal. Here, because the baseband component of the FB signal is associated with the BB signal, the IF signal detector 207 acquires an IF signal 303 by subtracting, for example, as illustrated in FIG. 6, a BB signal 302 from an FB signal 301. The IF signal 303 is the carrier component of, for example, 500 kHz in the FB signal and reflects the frequency of the local signals generated in the oscillators 103 and 106. In other words, the frequency of the IF signal 303 is associated with the radio frequency of the signal that is sent from the antenna.

The counter 208 counts the pulses of the IF signal detected by the IF signal detector 207. The number of pulses counted by the counter 208 per second corresponds to the frequency of the IF signal. Accordingly, for example, if the frequency of the IF signal is accurately 500 kHz, the counter 208 counts 500,000 ($=500\times10^3$) pulses for one second.

The register 209 registers a count value of the counter 208 for each defined measurement time and outputs the registered count value to the CPU 110. Then, after the register 209 outputs the count value to the CPU 110, the register 209 resets the count value. The measurement time that is the period in which the register 209 registers the count value is measured by the CPU 110 on the basis of the current time acquired from the synchronization with the NTP server 10 and the REC device 20.

Figure 7:
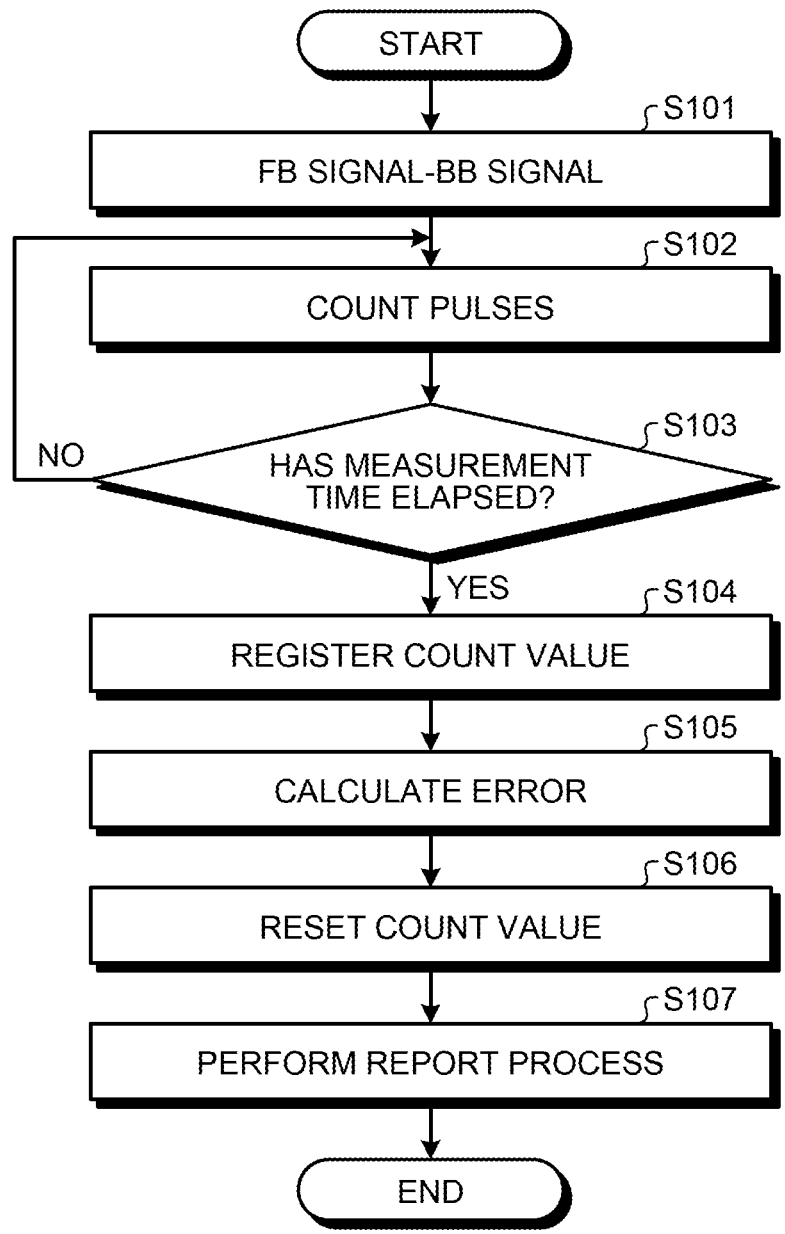
FIG. 7 is a flowchart illustrating a frequency error measurement process according to the first embodiment.

In the following, a frequency error measurement process performed by the RE device 100 having the configuration described above will be described with reference to the flowchart illustrated in FIG. 7 by way of specific examples.

When the BB signal sent from the REC device 20 is received by the RE device 100, the BB signal is subjected to distortion compensation by the distortion compensator 101, is subjected to DA conversion by the DA converter 102, and is subjected to up-conversion by the modulator 104. Then, the signal with the radio frequency obtained from the up-conversion is amplified by the power amplifier 105, is sent from the antenna, and is fed back to the mixer 107. The fed back signal is subjected to down-conversion by the mixer 107 and becomes the FB signal with the intermediate frequency. Namely, the FB signal in which the baseband component associated with the BB signal is superimposed on the carrier component of the intermediate frequency is output from the mixer 107 to the AD converter 108.

Then, the FB signal that has been subjected to AD conversion by the AD converter 108 is input to the FPGA 109. In contrast, the BB signal is also input to the FPGA 109 and the BB signal is delayed by the delay device 202, whereby the phases of the BB signal and the FB signal match. The BB signal and the FB signal are compared by the comparator 205. Then, the distortion compensation coefficients stored in the look-up table 201 are updated by the computing unit 206 such that the difference between the BB signal and the FB signal approaches zero.

Furthermore, because the baseband component of the FB signal is removed by the IF signal detector 207, the carrier component (IF signal) of the FB signal is acquired. Namely, the BB signal is subtracted from the FB signal by the IF signal detector 207 (Step S101), the IF signal is detected. The IF signal is a signal that has the intermediate frequency and that has been subjected to down-conversion by the mixer 107; however, because the oscillator 103 and the oscillator 106 generate a local signal by using the same clock of the BB signal, the IF signal is a signal that reflects the radio frequency at the time of up-conversion performed by the modulator 104. Accordingly, if the frequency of the IF signal is equal to the normal intermediate frequency, the radio frequency of the signal that is sent from the antenna is also equal to the normal radio frequency. In the following, as an example, it is assumed that the normal radio frequency is 2 GHz and assumed that the normal intermediate frequency is 500 kHz.

When the IF signal is acquired by the IF signal detector 207, the pulses of the IF signal are counted by the counter 208 (Step S102). This count is performed by counting a single wavelength of the IF signal as a single pulse.

At the same time of these processes, in the CPU 110, the defined measurement time is measured while the accurate current time is being acquired due to the periodic synchronization between the NTP server 10 and the REC device 20. Then, after the count of the pulses of the IF signal is started by the CPU 110, it is determined whether the measurement time has elapsed (Step S103). If the determination result indicates that the measurement time has not elapsed (No at Step S103), the pulses of the IF signal are continuously counted by the counter 208.

In the following, a specific example of the measurement time measured by the CPU 110 will be described. As described above, the CPU 110 acquires the accurate current time by the periodic synchronization with the NTP server 10 and the REC device 20. However, because the synchronization between the devices is performed at a predetermined period, for example, at an interval of 256 seconds, an error about the maximum of 810 microseconds per, for example, 24 hours occurs in each of the devices when compared with the higher-level devices arranged at the synchronization destination. Namely, when compared with the measurement in the NTP server 10, regarding the measurement in the REC device 20, an error about the maximum of 810 microseconds per 24 hours occurs. Furthermore, when compared with the measurement in the REC device 20, regarding the measurement in the CPU 110 in the RE device 100, an error about the maximum of 810 microseconds per 24 hours occurs. Furthermore, because the NTP server 10 also acquires the current time from the synchronization, the measurement in the NTP server 10 also includes an error about the maximum of 810 microseconds per 24 hours.

In this way, the measurement in the CPU 110 in the RE device 100 includes an error about the maximum of 2430 (=810×3) microseconds, the needed measurement time from which the accuracy of a desired frequency error is obtained is previously determined by considering this error. Specifically, for example, as illustrated in FIG. 8, if the accuracy of the desired frequency error is 0.01 parts per million (ppm), the needed measurement time is 72 hours. Similarly, the accuracy of the desired frequency error is 0.02 ppm, the needed measurement time is 36 hours and, if the accuracy of the desired frequency error is 0.03 ppm, the needed measurement time is 24 hours.

The example described above indicates the measurement time for each piece of desired accuracy that is obtained with the assumption that an error of the time synchronization between the devices is about the maximum of 810 microseconds; however, it is also possible to fix the desired accuracy to, for example, 0.01 ppm and determine the measurement time for each error of the time synchronization. Specifically, for example, as illustrated in FIG. 9, if the error of the time synchronization is equal to or less than 864 microseconds per 24 hours, the needed measurement time is 72 hours. Namely, if the error of the time synchronization is equal to or less than 864 microseconds per 24 hours, by performing the measurement for 72 hours, it is possible to obtain a frequency error with the accuracy of 0.01 ppm. Similarly, if the error of the time synchronization is equal to or less than 432 microseconds per 24 hours, the needed measurement time is 36 hours and, if the error of the time synchronization is equal to or less than 288 microseconds per 24 hours, the needed measurement time is 24 hours.

If the measurement time defined described above has elapsed (Yes at Step S103), the count value in the counter 208 is registered in the register 209 (Step S104) and is acquired by the CPU 110. Then, a frequency error is calculated from the count value by the CPU 110 (Step S105). Specifically, the number of pulses per second is calculated from the count value by the CPU 110 and the error between the obtained frequency and the normal intermediate frequency becomes the frequency error.

Figure 10:
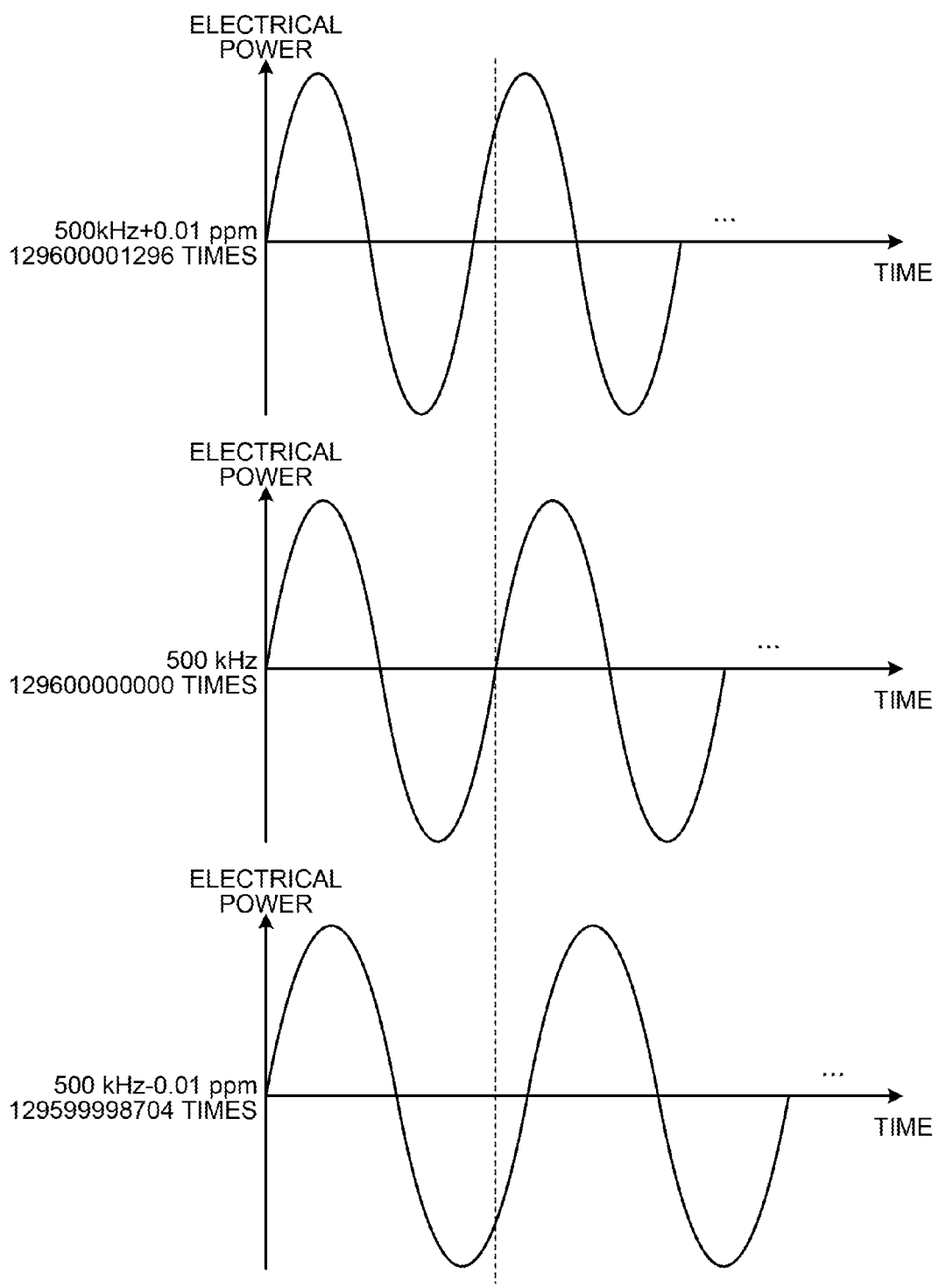
FIG. 10 is a schematic diagram illustrating the relationship between count values and frequency errors.

For example, when the normal intermediate frequency is 500 kHz and the measurement time is 72 hours, if a frequency error is 0, the count value acquired by the CPU 110 is $1.296 \times 10^{11}$. In contrast, as illustrated in FIG. 10, if a frequency error with 0.01 ppm is present, the count value acquired by the CPU 110 is shifted by 1296. Namely, if the frequency of the IF signal is greater than the normal intermediate frequency by 0.01 ppm, as indicated in the upper portion of FIG. 10, the count value with the frequency error greater than that at the time of zero by 1296 is obtained. Furthermore, if the frequency of the IF signal is smaller than the normal intermediate frequency by 0.01 ppm, as indicated in the lower portion of FIG. 10, the count value with the frequency error smaller than that at the time of zero by 1296 is obtained.

When the frequency error is calculated by the CPU 110 on the basis of the relationship between the count value and the frequency error described above, the count values registered in the register 209 are reset (Step S106). After the count values are reset, the count value of the counter 208 may be registered in the register 209 when the measurement time has elapsed again. Furthermore, the frequency error calculated by the CPU 110 is reported to the monitoring terminal device 30 via the REC device 20 (Step S107). At this time, every time, for example, the measurement time has elapsed, information that indicates the value of a frequency error may be created by the CPU 110 and may be sent to the monitoring terminal device 30. Furthermore, every time, for example, the measurement time has elapsed, the frequency error may be compared with a predetermined threshold by the CPU 110 and, if the frequency error becomes equal to or greater than a predetermined threshold, the information indicating that state may also be sent to the monitoring terminal device 30.

Figure 11:
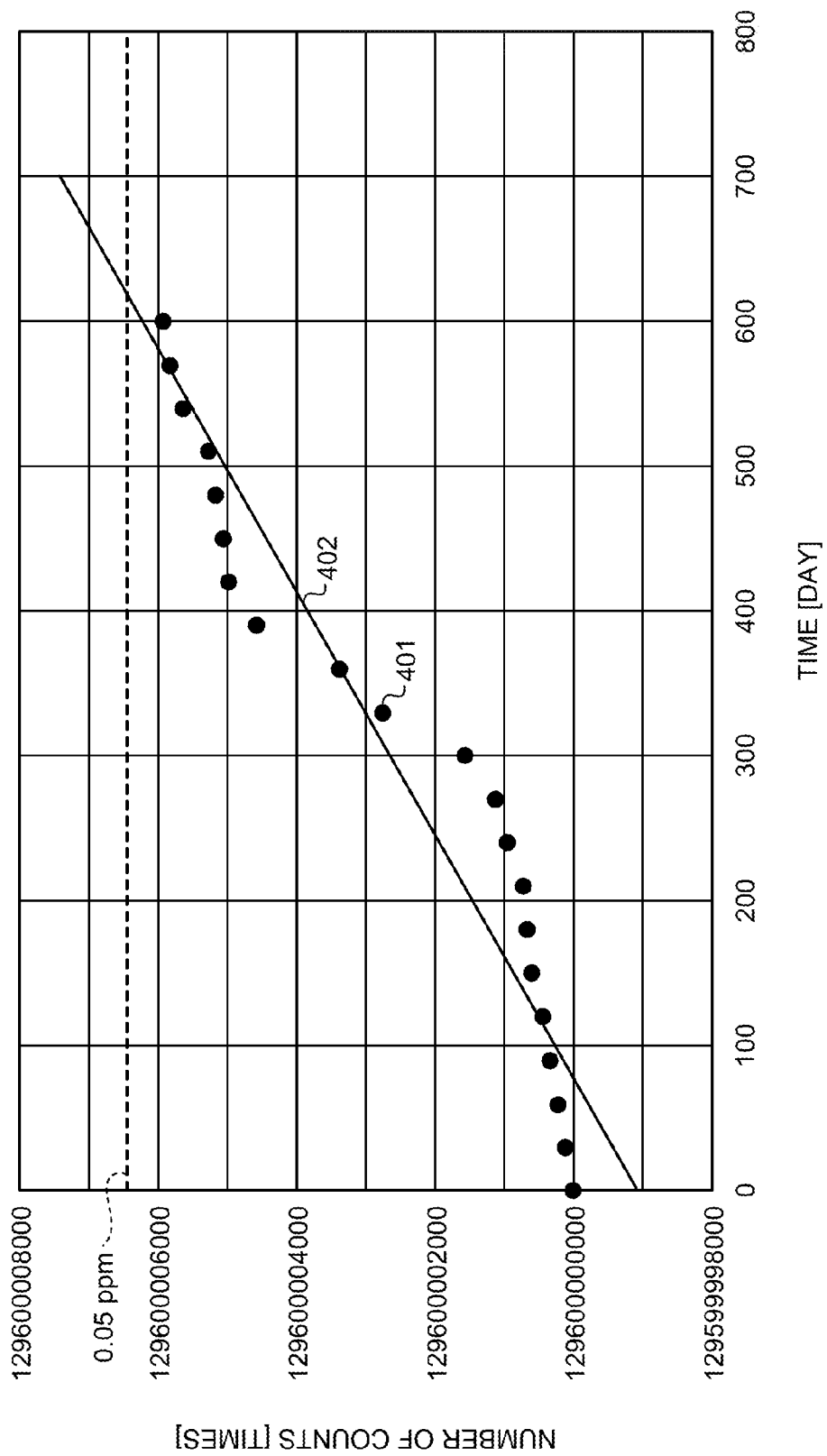
FIG. 11 is a schematic diagram illustrating a specific example of a prediction line of the frequency errors.

Furthermore, a prediction line of the frequency errors may also be derived, by the CPU 110, from the count values obtained at the time of a plurality of measurement times and then information indicating the remaining time before each of the frequency errors reaches the predetermined threshold may also be sent to the monitoring terminal device 30. Specifically, for example, as illustrated in FIG. 11, by using, for example, the least squares method by the CPU 110, a prediction line 402 of the frequency errors for each measurement time is derived from plots 401 of the count values. Then, the number of remaining days before the count value for each measurement time reaches the predetermined threshold is acquired by the CPU 110 from the prediction line 402. In the example illustrated in FIG. 11, it is found that the prediction line 402 is derived by the plots 401 for measurement times before 600 days and it is found that the number of remaining days before the count value for each measurement time reaches the count value corresponding to the threshold 0.05 ppm of the frequency error is about 20 days. Thus, information including the number of remaining days is created by the CPU 110 and sent to the monitoring terminal device 30.

As described above, according to the embodiment, a carrier component is detected by removing the baseband component corresponding to the BB signal from the FB signal that is down converted to the intermediate frequency. Then, by counting the pulses of the carrier component during the measurement time that is measured on the basis of the accurate time information obtained from outside, an error included in the radio frequency and the intermediate frequency in the RE device is calculated. Consequently, a new oscillation source or the like is not arranged in order to measure a frequency error and, furthermore, the frequency can be accurately measured with a simple circuit configuration. As a result, it is possible to measure a frequency error at low cost while suppressing an increase in the size of the circuit.

[b] Second Embodiment

The characteristic of a second embodiment is that the length of the subsequent measurement time or the period of time synchronization is changed in accordance with the magnitude of the frequency error that is obtained from the measurement of the pulses at the measurement time.

Because the configuration of the radio communication system and the RE devices according to the second embodiment is the same as the first embodiment, the descriptions thereof will be omitted. The second embodiment differs from the first embodiment in that the frequency error calculated by the CPU 110 is compared with a predetermined value and the periods of the measurement time and the time synchronization are changed in accordance with the comparison result.

Figure 12:
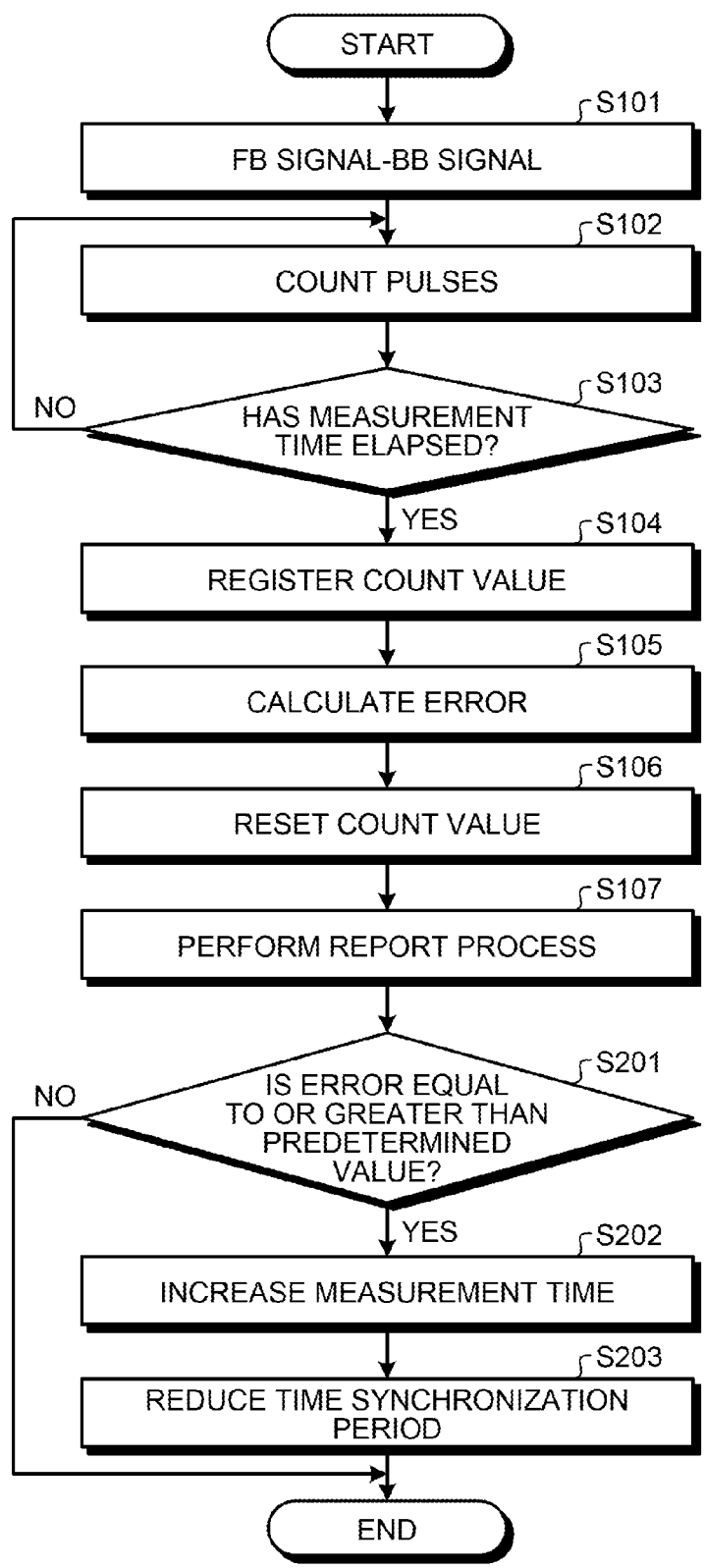
FIG. 12 is a flowchart illustrating a frequency error measurement process according to a second embodiment.

FIG. 12 is a flowchart illustrating a frequency error measurement process according to a second embodiment. In FIG. 12, components having the same configuration as those illustrated in FIG. 7 are assigned the same reference numerals and descriptions thereof will be omitted.

After the BB signal has been subjected to DA conversion and up-conversion, if the BB signal is amplified and sent by the power amplifier 105, the sent signal with the radio frequency is down converted to the intermediate frequency and is input to the FPGA 109 as the FB signal. Then, because the BB signal is subtracted from the FB signal by the IF signal detector 207 (Step S101), the IF signal is detected. If the IF signal is acquired by the IF signal detector 207, the pulses of the IF signal are counted by the counter 208 (Step S102).

At the same time of these processes, in the CPU 110, the defined measurement time is measured while the accurate current time is being acquired by the periodic synchronization between the NTP server 10 and the REC device 20. Then, the CPU 110 determines whether the measurement time has elapsed since the count of the pulses of the IF signal is started (Step S103). If the determination result indicates that the measurement time has not elapsed (No at Step S103), the pulses of the IF signal are continuously counted by the counter 208. Then, if the measurement time has elapsed (Yes at Step S103), the count value in the counter 208 is registered in the register 209 (Step S104) and is acquired by the CPU 110. Then, a frequency error is calculated from the count value by the CPU 110 (Step S105).

If the frequency error is calculated by the CPU 110, the count value registered in the register 209 is reset (Step S106). Furthermore, the frequency error calculated by the CPU 110 is reported to the monitoring terminal device 30 via the REC device 20 (Step S107).

At the same time when the frequency error is reported to the monitoring terminal device 30, the CPU 110 determines whether the frequency error is equal to or greater than the predetermined value (Step S201). It is preferable that the predetermined value compared with the frequency error be a value smaller than the upper limit of the frequency error that is defined by, for example, law. Namely, if the upper limit of the frequency error defined by, for example, the law is 0.05 ppm, the predetermined value that is compared with the frequency error by the CPU 110 is preferably set to 0.04 ppm or the like.

If the comparison result indicates that the frequency error is less than the predetermined value (No at Step S201), the count value of the counter 208 is registered in the register 209 after the same measurement time as the immediately previous measurement time has elapsed without changing the periods of the measurement time and the time synchronization. At this point, if the frequency error is less than the predetermined value and is relatively small, even if the accuracy of the measurement of the measurement time is slightly low, there is no major effect. Consequently, there is no problem even if the period of time synchronization is set to relatively long time and thus the period of time synchronization with the REC device 20 may also be set to, for example, a period of 512 seconds. Furthermore, by increasing the period of time synchronization, it is possible to reduce the processing load of the CPU 110 and also possible to reduce the processing load of the REC device 20 and the NTP server 10 that are located at the synchronization destination.

In contrast, if the comparison result at Step S201 indicates that the frequency error is equal to or greater than the predetermined value (Yes at Step S201), the CPU 110 determines to increase the measurement time (Step S202). Namely, if the result of counting the pulses of the measurement time of, for example, 36 hours indicates that the frequency error is equal to or greater than the predetermined value, it is determined that the subsequent measurement time is set to, for example, 72 hours. In this way, by increasing the measurement time, it is possible to improve the measurement accuracy of the frequency error and thus it is possible to accurately determine the time at which a maintenance work is needed.

Furthermore, as an increase in the measurement time, the CPU 110 determines to reduce the time synchronization (Step S203). Namely, if the period of the time synchronization with the REC device 20 is, for example, 512 seconds, the CPU 110 determines to set the period of this time synchronization to, for example, 256 seconds. In this way, by reducing the period of the time synchronization, it is possible to improve the accuracy of the measurement of the measurement time and further improve the measurement of a frequency error.

As described above, according to the embodiment, a frequency error is calculated from the number of pulses of the IF signal counted at the measurement time and, if the frequency error is equal to or greater than the predetermined value, the periods of the measurement time and the time synchronization are changed. Consequently, if the frequency error becomes relatively large, the measurement accuracy of the frequency error can be improved.

Furthermore, in the second embodiment described above, when a frequency error is equal to or greater than the predetermined value, both the periods of the measurement time and the time synchronization are changed; however, only one of the periods may also be changed. Even when only one of the periods is changed, when the frequency error becomes large, it is possible to improve the measurement accuracy of the frequency error.

Furthermore, in each of the embodiments described above, the frequency error is calculated by the CPU 110 in each of the RE devices 100; however, the calculation of the frequency error may also be performed by, for example, a processor arranged in the REC device 20. Namely, the count value registered in the register 209 in each of the RE devices 100 is notified to the REC device 20 and, for example, a processor, such as a CPU or the like, arranged in the REC device 20 may also calculate the frequency error, similar to the CPU 110 according to each of the embodiments described above. At this time, if the tendencies of the frequency errors in all of the RE devices 100 connected to the REC device 20 are similar, there is a possibility that degradation of the optical fibers that connect the RE devices 100 and the REC device 20 or the components of each of the RE devices 100 is not caused by the frequency errors. Namely, if the tendencies of the frequency errors in the RE devices 100 are similar, it may also possible to determine that the clock of the BB signal sent from the REC device 20 is abnormal, due to, for example, a failure of the REC device 20.

Furthermore, in each of the embodiments described above, the current time is acquired by using NTP and the measurement time is measured; however, acquiring the time information is not limited to the method performed by using NTP. Namely, a method other than that using NTP may also be used to accurately measure the measurement time as long as time information can be acquired with high accuracy. At this time, similar to the method performed by using NTP, the current time may also be acquired as time information from outside, or alternatively, information indicating that measurement time has elapsed may also be acquired as time information from outside.

According to an aspect of an embodiment of the radio communication device and the frequency error measurement method disclosed in the present invention, an advantage is provided in that a frequency error can be measured at low cost while suppressing an increase in the size of a circuit.

All examples and conditional language recited herein are intended for pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A radio communication device comprising:
   a transmission unit that performs a radio transmission process on a baseband signal in which transmission data is included and that transmits a signal in which the baseband signal is superimposed on a carrier wave;
   a feedback unit that feeds back the signal transmitted by the transmission unit;
   a detecting unit that detects a carrier wave component by removing a component corresponding to the baseband signal from a feedback signal that is fed back by the feedback unit;
   a counting unit that counts pulses of the carrier wave component detected by the detecting unit; and
   a calculating unit that calculates a frequency error of the carrier wave by using a count value obtained by the counting unit.

2. The radio communication device according to claim 1, wherein
   the transmission unit includes
      a DA converter that performs digital-to-analogue (DA) conversion on the baseband signal,
      a modulator that superimposes an analog baseband signal that is obtained by the DA converter on a carrier wave of a radio frequency by using a clock of the baseband signal, and
      a power amplifier that amplifies a signal output from the modulator, and
   the feedback unit includes
      a converting unit that converts a frequency of the signal amplified by the power amplifier to an intermediate frequency by using the clock of the baseband signal, and
      an AD converter that performs analogue-to-digital (AD) conversion on the feedback signal converted by the converting unit.

3. The radio communication device according to claim 1, further comprising an estimating unit that derives a prediction line of frequency errors on the basis of the frequency error calculated by the calculating unit and that estimates, by using the prediction line, when the frequency error reaches a predetermined threshold.

4. The radio communication device according to claim 1, wherein the calculating unit calculates the frequency error of the carrier wave by using the count value obtained during measurement time measured on the basis of time information that is acquired from outside.

5. A radio communication system comprising:
   a signal processing unit; and
   a plurality of radio communication devices connected to the signal processing unit, wherein
   each of the radio communication devices includes
      a transmission unit that performs a radio transmission process on a baseband signal in which transmission data received from the signal processing unit is included and that transmits a signal in which the baseband signal is superimposed on a carrier wave,
      a feedback unit that feeds back the signal transmitted by the transmission unit,
      a detecting unit that detects a carrier wave component by removing a component corresponding to the baseband signal from a feedback signal that is fed back by the feedback unit, and
      a counting unit that counts pulses of the carrier wave component detected by the detecting unit, and
   the signal processing unit
      receives a count value obtained by the counting unit from the plurality of the radio communication devices,
      calculates a frequency error of the carrier wave by using the received count value, and
      when frequency errors calculated for the plurality of radio communication devices indicate similar tendencies, determines that the signal processing unit is abnormal.

6. A frequency error measurement method comprising:
   performing a radio transmission process on a baseband signal in which transmission data is included and transmitting a signal in which the baseband signal is superimposed on a carrier wave;
   feeding back the transmitted signal;
   detecting a carrier wave component by removing a component corresponding to the baseband signal from a feedback signal that is fed back;
   counting pulses of the detected carrier wave component; and
   calculating a frequency error of the carrier wave by using a count value obtained at the counting.

* * * * *